United States Patent
Harada et al.

(10) Patent No.: US 7,459,793 B2
(45) Date of Patent: Dec. 2, 2008

(54) METHODS FOR FORMING CONTACT HOLE, FOR MANUFACTURING CIRCUIT BOARD AND FOR MANUFACTURING ELECTRO-OPTICAL DEVICE

(75) Inventors: Mitsuaki Harada, Chino (JP); Soichi Moriya, Chino (JP)

(73) Assignee: Seiko Epson Corporation (JP)

( * ) Notice: Subject to any disclaimer, the term of this patent is extended or adjusted under 35 U.S.C. 154(b) by 170 days.

(21) Appl. No.: 11/461,112

(22) Filed: Jul. 31, 2006

(65) Prior Publication Data

US 2006/0263945 A1    Nov. 23, 2006

Related U.S. Application Data

(62) Division of application No. 11/150,290, filed on Jun. 13, 2005, now Pat. No. 7,199,049.

(30) Foreign Application Priority Data

Jul. 27, 2004    (JP) .............................. 2004-218872

(51) Int. Cl.
*H01L 23/48* (2006.01)
*H01L 23/52* (2006.01)
*H01L 29/40* (2006.01)

(52) U.S. Cl. ........................ 257/774; 257/359; 257/396; 257/622; 257/E21.007; 257/E21.273; 257/E21.249; 257/E21.309; 257/E21.577

(58) Field of Classification Search ................. 257/359, 257/396, 410, 412, 622, 642, 643, 774, 779, 257/784
See application file for complete search history.

(56) References Cited

U.S. PATENT DOCUMENTS

| | | | |
|---|---|---|---|
| 6,690,004 B2 * | 2/2004 | Miller et al. | ................. 250/286 |
| 6,717,181 B2 | 4/2004 | Murakami et al. | |
| 6,969,480 B2 * | 11/2005 | Dalton et al. | ................ 264/255 |
| 7,199,049 B2 * | 4/2007 | Harada et al. | ................ 438/637 |
| 2005/0181533 A1 | 8/2005 | Kawase et al. | |

FOREIGN PATENT DOCUMENTS

| | | |
|---|---|---|
| JP | 02-021507 | 1/1990 |
| JP | 10-096960 | 4/1998 |
| JP | 2000-260870 | 9/2000 |
| JP | 2003-127405 | 5/2003 |
| KR | 2000-0076824 | 12/2000 |
| KR | 2003-0035892 | 5/2003 |
| WO | 02/33740 | 4/2002 |

OTHER PUBLICATIONS

Communication from Korean Patent Office regarding corresponding application.

* cited by examiner

*Primary Examiner*—David Nhu
(74) *Attorney, Agent, or Firm*—Harness, Dickey & Pierce, P.L.C.

(57) ABSTRACT

A method for forming a contact hole, a method for manufacturing a circuit board and a method for manufacturing an electro-optical device that increase the reliability of electrical coupling via a conductive part and prevent wire-breaking due to projections when forming a contact hole in an interlayer film by using a needle, and burying a conductive material in the contact hole is provided.

6 Claims, 4 Drawing Sheets

METHODS FOR FORMING CONTACT HOLE, FOR MANUFACTURING CIRCUIT BOARD AND FOR MANUFACTURING ELECTRO-OPTICAL DEVICE

RELATED APPLICATIONS

This application is a divisional of U.S. patent application Ser. No. 11/150,290 filed on Jun. 13, 2005, now U.S. Pat. No. 7,199,049. This application claims the benefit of Japanese Patent Application No. 2004-218872 filed Jul. 27, 2004. The disclosures of the above applications are incorporated herein by reference.

FIELD OF THE INVENTION

The present invention relates to a method for forming a contact hole, a method for manufacturing a circuit board and a method for manufacturing an electro-optical device such as a liquid crystal device, an organic electro-luminescence (EL) device and an electrophoretic device.

BACKGROUND OF THE INVENTION

For a semiconductor element, a technique has been known to establish electrical coupling between electrodes provided on different layers over a circuit board. According to the technique as described in Japanese Unexamined Patent Publication No. 10-96960 for example, contact holes are formed by using photolithography and etching, and then an electrically conductive material is buried in the contact holes for providing electrical coupling between the electrodes.

However, using photolithography and etching involves pattern-forming, which complicates the manufacturing steps and requires vacuum equipment and many chemicals, resulting in higher manufacturing costs.

Meanwhile, a technique for easily forming contact holes has been known for example, as disclosed in Japanese Unexamined Patent Publication No. 2-21507. According to the technique, in forming contact holes for both sides of a base member composing a conductive sheet, through holes are mechanically formed in the base member by using a needle or the like instead of photolithography and etching.

Based on this technique, the following method may be used for a circuit board that includes a first electrode provided on a substrate, an interlayer film covering the first electrode and a second electrode provided on the interlayer film: the interlayer film is mechanically perforated or everted by using a needle or the like to easily form contact holes between the first and second electrodes; and a conductive material is buried in the contact holes for providing electrical coupling between the first and second electrodes.

In the case of perforating the interlayer film that covers the first electrode using a needle or the like to form contact holes, however, if the diameter of the needle is small, the diameter of the contact holes formed in the interlayer film is also correspondingly small. In this case, the contact holes are blocked due to the elastic force of the interlayer film. Therefore, in burying a conductive material in the contact holes, the conductive material can not reach the surface of the first electrode since the contact holes are blocked halfway.

As a result, electrical coupling between the first and second electrodes is precluded. Also, in the case of everting the interlayer film on the electrode by using a needle to form contact holes, and burying a conductive material therein, the everted portions of the interlayer film form projections on the interlayer film. If wires coupled to the contacts are formed on the interlayer film in this state, wire-breaking is likely to occur on the projections.

SUMMARY OF THE INVENTION

The present invention is made in consideration of the above-described circumstances. According to one aspect, the present invention provides a method for forming a contact hole, a method for manufacturing a circuit board and a method for manufacturing an electro-optical device that increase the reliability of electrical coupling and prevent wire-breaking due to projections when forming a contact hole in an interlayer film by using a needle, and burying a conductive material in the contact hole.

In order to solve the above-described problems, according to an aspect of the present invention, a method for forming a contact hole of a circuit board includes a first electrode on a substrate, an interlayer film on the first electrode and a second electrode on the interlayer film, the first electrode being electrically coupled to the second electrode via the contact hole. The method comprises inserting a needle that includes a solvent into the interlayer film to dissolve the interlayer film with the solvent, so as to form the contact hole.

According to another aspect of the invention, a method for manufacturing a circuit board includes a first electrode on a substrate, an interlayer film on the first electrode and a second electrode on the interlayer film, the first electrode being electrically coupled to the second electrode via a contact hole. The method comprises: forming the contact hole by inserting a needle that includes a solvent into the interlayer film to dissolve the interlayer film with the solvent; and injecting an electrically conductive material into the contact hole.

According to at least some aspects, the interlayer film can be perforated mechanically so that the hole reaches the surface of the first electrode while the interface between the interlayer film and needle can be dissolved chemically with the solvent included in the needle. Thus, the contact hole having a diameter larger than that of the needle is formed in the interlayer film.

In addition, since the interlayer film in the region for forming the contact hole is removed by the solvent, the contact hole is not blocked by the elastic force of the interlayer film. Therefore, the conductive material can be buried in the contact hole to reach the first electrode, allowing the formation of the contact hole with high reliability for electrically coupling the first and second electrodes.

Furthermore, in aspects of the invention, the insulating film need not be everted with the needle when forming the contact hole. Therefore, projections resulting from the everted parts are not formed on the surface of the insulating film. Thus, in the case of forming a wire for electrically coupling the first electrode to the second electrode via the contact hole provided in the interlayer film, for example, the breaking of the wire due to the projections can be avoided.

Accordingly, the reliability of electrical coupling between the first and second electrodes can be improved.

The forming of a contact hole may include forming a plurality of contact holes simultaneously by using a plurality of needles. Thus, the number of manufacturing steps can be reduced. Also, the electrically conductive material is preferably buried in the contact hole by a droplet discharge method. According to this method, a wire or the like for electrically coupling the second electrode to the contact hole can be fabricated in the same droplet discharge step, reducing the number of manufacturing steps.

An organic thin-film transistor provided with the second electrode as a gate electrode may be formed on the circuit board.

In an organic thin-film transistor, a gate insulating film can be made up of an organic film, for example. In the case of forming the gate insulating film by spin coating, for example, the gate insulating film is formed as part of the interlayer film covering the first electrode. Thus, according to this aspect of the invention, the gate insulating film provided on the first electrode also can be dissolved by the solvent included in the needle to form a contact hole. Therefore, the contact hole having high reliability can be formed as described above.

A method for manufacturing an electro-optical device according to another aspect of the invention comprises using the method for manufacturing a circuit board.

According to this aspect, since the method for forming a circuit board is used, breakage of the wire coupling the first electrode to the second electrode is prevented while the reliability of electrical coupling is improved. Thus, the reliability of the manufactured electro-optical device itself can be improved.

DETAILED DESCRIPTION OF THE INVENTION

Illustrative embodiments of the present invention will be described below in detail.

Figure 1:
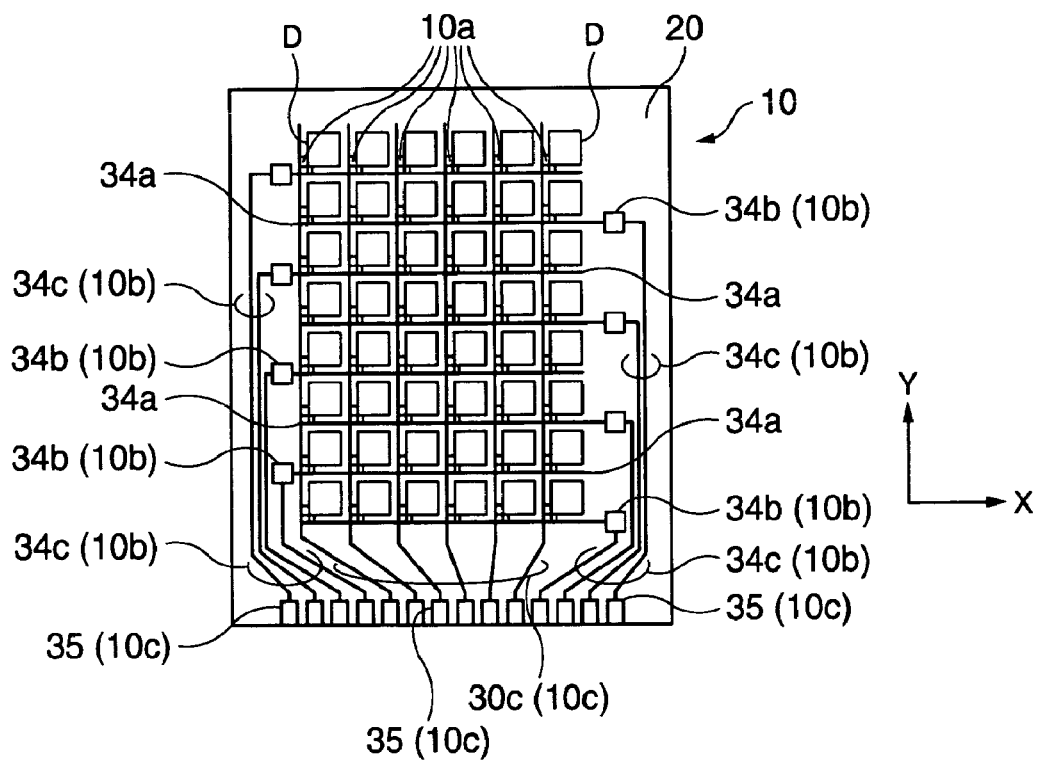
FIG. 1 is a plan view of a circuit board manufactured according to aspects of the invention.

FIG. 1 is a diagram showing a circuit board manufactured by employing a method for forming a contact hole according to a first embodiment of the invention. A circuit board 10 is illustrated in FIG. 1.

Referring to FIG. 1, the circuit board 10 includes a plurality of organic thin-film transistors 10a, a plurality of gate lines 34a and a plurality of pixel electrodes D substantially centered on a rectangle substrate 20, for example. Gate line coupling parts 34b are formed on an outer circumference part 10b along the longitudinal side direction of the circuit board 10. External coupling terminals 35 coupled to gate lead wires 34c from the gate line coupling parts 34b or source lead wires 30c are formed on an outer circumference part 10c along one short side of the circuit board 10.

Figure 2:
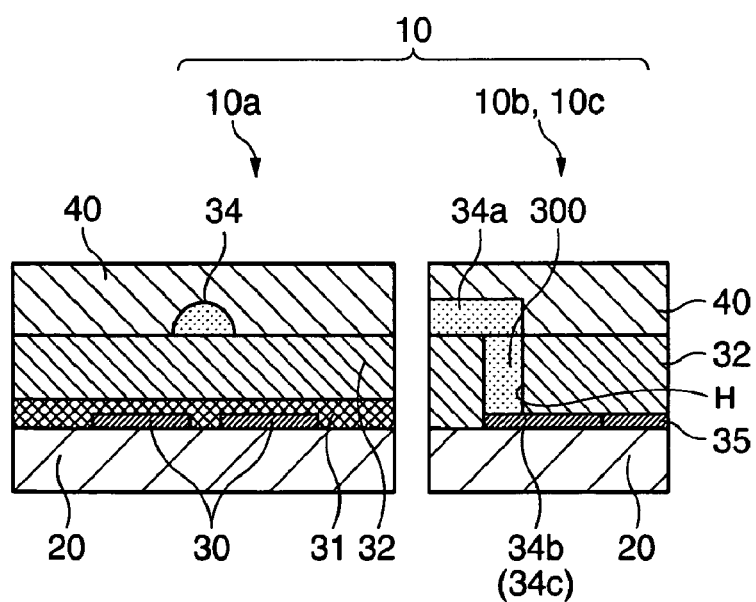
FIG. 2 is a side sectional view of an essential part of the circuit board manufactured according to aspects of the invention.

FIG. 2 is a side sectional view of the circuit board 10 along the X-direction in FIG. 1.

The circuit board 10 includes the rectangle substrate 20 being flexible and made of, for example, polycarbonate, and the gate line coupling part (first electrode) 34b formed on the substrate 20 and coupled to a gate electrode to be described later. The circuit board 10 also includes an insulating layer (interlayer film) 32 disposed on the gate line coupling part 34b and a gate electrode (second electrode) 34 formed on the insulating film 32. An ink receptive layer (not shown) is formed on the insulating film 32. Thus, when forming the gate electrode 34 and the gate line 34a by a droplet discharge method (referred to as an ink jet method, hereinafter) as described later, the discharged conductive material does not move on the film.

In the insulating film 32 provided on the gate line coupling part 34b, an electrically conductive part 300 having a conductive material buried in a contact hole H is formed.

The gate electrode 34 is coupled to the gate line coupling part 34b via the gate line 34a and the conductive part 300 that are formed by the ink jet method as described above. The gate line coupling part 34b is electrically coupled to the external coupling terminal 35 via the gate lead wire 34c as shown in FIG. 1.

Below the gate electrode 34, source and drain electrodes 30 are provided on the substrate 20, constituting an organic thin-film transistor 10a having a so-called top gate structure. A protective film 40 is disposed over the insulating film 32, constituting the circuit board 10.

A method for forming a contact hole in the steps for manufacturing the circuit board 10, and constitutional elements of the circuit board 10 will be described with reference to FIGS. 3A to 3F, FIGS. 4A to 4E and FIG. 5. FIG. 5 is a plan view corresponding to FIG. 1 and illustrating the circuit board 10 in the step of FIG. 3D.

Figure 3A:
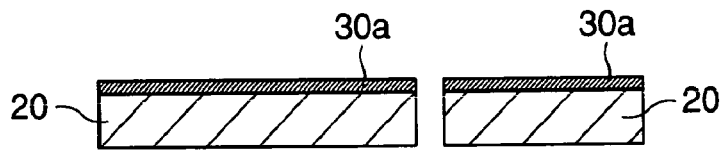
FIGS. 3A to 3F are explanatory diagrams illustrating manufacturing steps of the circuit board according to aspects of the invention.

First, as shown in FIG. 3A, the substrate 20 is thoroughly cleaned and degassed. Then, a metal film 30a is deposited by vapor deposition or sputtered on the whole surface of the substrate 20. Any material having excellent conductivity may be used for the metal film 30a.

Figure 3B:
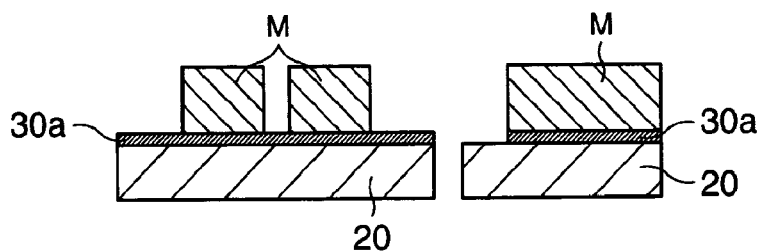

Referring to FIG. 3B, a photoresist is applied on the whole surface of the metal film 30a by spin coating, and is hardened by heat treatment. Then, exposure and development treatment are performed for the photoresist to form a mask M.

Figure 3C:
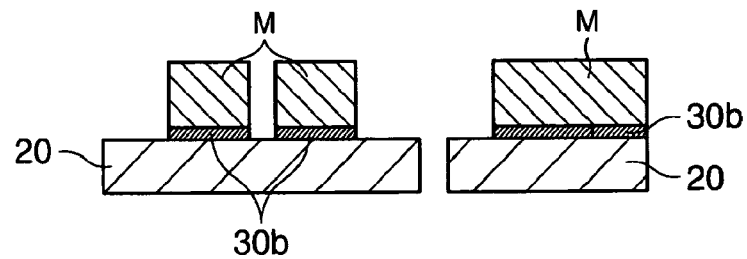

Next, as shown in FIG. 3C, etching is conducted to form a metal film pattern 30b in accordance with the opening pattern of the mask M.

Figure 3D:
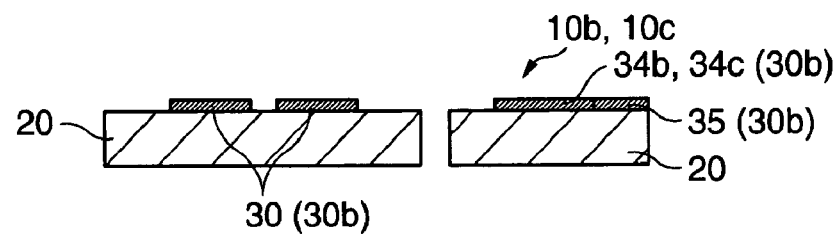

Subsequently, as shown in FIG. 3D, the mask M is removed, and thus only the metal-film pattern 30b remains on the substrate 20. The metal film pattern 30b serves as the source and drain electrodes 30 of the organic thin-film transistor 10a. The film pattern 30b also serves as the gate line coupling part 34b, the gate lead wire 34c, the external coupling part 35 and the source lead wire 30c as shown in FIG. 5.

Figure 3E:
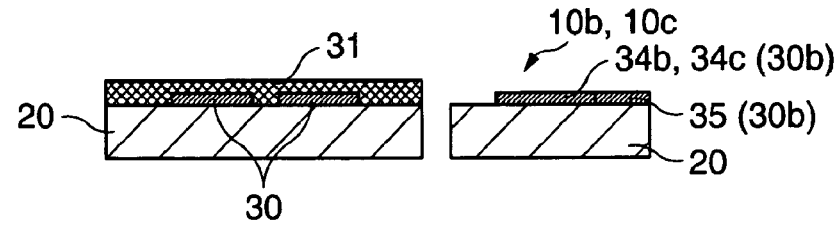

Then, as shown in FIG. 3E, a semiconductor layer 31 is formed on the source and drain electrodes 30 by spin coating. Examples of the material of the semiconductor layer 31 include: low-molecular-weight organic semiconductor materials such as naphthalene, anthracene, tetracene, pentacene, hexacene, phthalocyanine, perylene, hydrazone, triphenylmethane, diphenylmethane, stilbene, aryl vinyl, pyrazoline, triphenylamine, triarylamine, oligothiophene, phthalocyanine and derivatives of these materials; and polymer organic semiconductor materials such as poly(N-vinylcarbazole), polyvinylpyrene, polyvinylanthracene, polythiophene, polyhexylthiophene, poly(p-phenylenevinylene), polythienylenevinylene, polyarylamine, pyrene formaldehyde resin, ethylcarbazole formaldehyde resin, fluorene-bithiophene copolymer, fluorene-arylamine copolymer and derivatives of these materials. One or a combination of two or more of the above materials can be used. Particularly, it is preferable to use a polymer organic semiconductor material.

The semiconductor layer 31 on the gate line coupling part 34b and the gate lead wire 34c on the outer circumference parts 10b and 10c is removed by patterning, with the outer circumference parts 10b and 10c being isolated from the semiconductor layer 31 on the source and drain electrodes 30.

Instead of removing the semiconductor layer 31 by patterning after depositing the layer 31 over the whole surface, the semiconductor layer 31 may be selectively formed at desired positions by the ink jet method for reducing the number of steps.

Figure 3F:
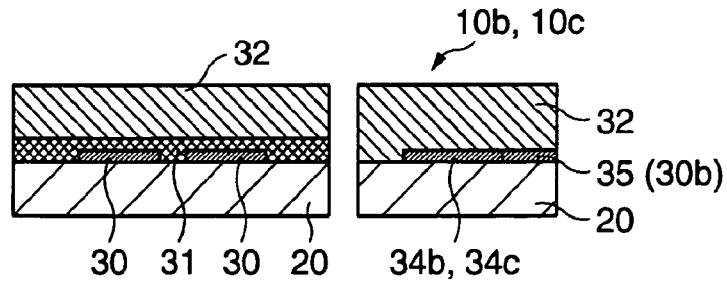

As shown in FIG. 3F, an insulating polymer is applied by spin coating to form the insulating layer 32. As the polymer, polyvinylphenol or phenol resin (novolac resin) can be used. Alternatively, acrylic resin such as polymethylmethacrylate (PMMA), polycarbonate (PC), polystyrene, polyolefin, polyimide, fluororesin or the like can also be used. In the present embodiment, a butyl acetate solution of PMMA may be applied by spin coating.

In the case of forming the insulating layer 32 by applying a solution, it is necessary to prevent the solvent contained in the solution of the insulating layer 32 from swelling or dissolving the semiconductor layer 31 and the substrate 20. Particular attention is required if the semiconductor layer 31 is soluble in the solvent. Since the semiconductor layer 31 is made up of conjugated molecules or polymers containing aromatic rings, it is susceptible to being dissolved in aromatic hydrocarbons. Accordingly, a hydrocarbon except for aromatic hydrocarbons or a ketone, ether, or ester organic solvent is preferably used for applying the insulating layer 32.

Furthermore, it is preferable that the insulating layer 32 be insoluble in a liquid material of the gate electrode 34 to be described later. A receptive layer (not shown) is formed over the insulating layer 32 in order to improve the wettability and contact angle of the liquid material of the gate electrode 34 and the gate line 34a to be formed in a later step.

The conductive part 300 allowing electrical coupling between the gate electrode 34 to be formed on the insulating film 32 and the gate line coupling part 34b is formed.

Figure 4A:
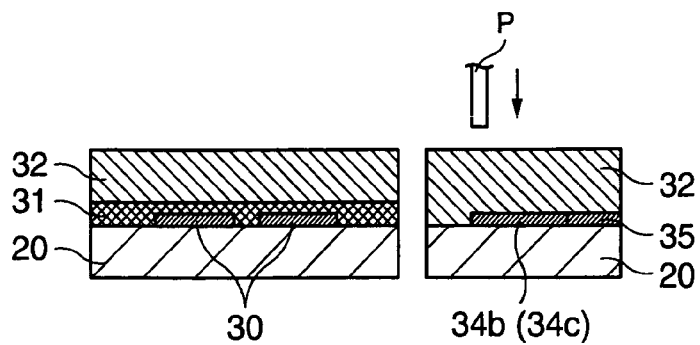
FIGS. 4A to 4E are explanatory diagrams illustrating steps of a method for forming a conductive part according to aspects of the invention.
Figure 5:
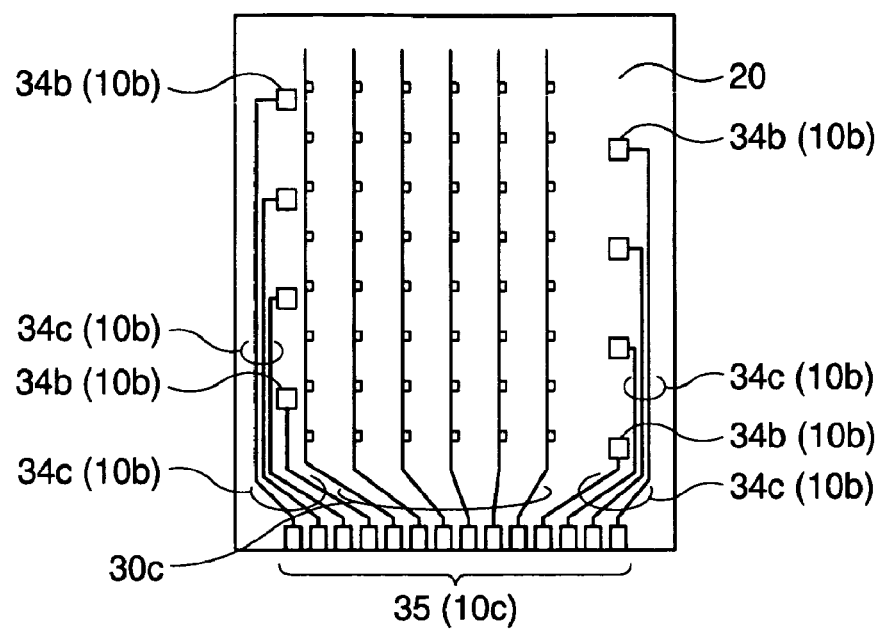
FIG. 5 is a plan view of the circuit board in an intermediate step of the manufacturing steps according to aspects of the invention.

First, as shown in FIG. 4A, a needle P is disposed above the interlayer film 32 in which the conductive part 300 is to be formed. The needle P includes a solvent (e.g. acetone) that can dissolve the insulating film 32. By allowing the needle P to include a solvent, the needle P having a porous structure may be used, for example. This structure eliminates the need to coat the needle P with a solvent prior to inserting the needle P into the insulating film 32 as described later.

Instead of using the porous needle, the needle P having a hollow structure like a syringe needle may be used, and a solvent may be forced out from the inside of the needle P when inserting the needle P. Alternatively, the needle P may be dipped in a liquid bottle or the like containing a solvent for applying the solvent to the needle P, and then may be inserted into the insulating film 32.

Note that the needle P is made of a material having such strength that the needle can perforate the insulating film 32.

Subsequently, the needle P is inserted into the insulating film 32 in the arrow direction in FIG. 4A. This action forms a mechanical hole in the insulating film 32 with the needle P. When the needle P is inserted, the elastic force of the insulating film 32 causes close contact between the needle P and the insulating film 32 in the hole. At this time, the solvent included in the needle P starts to dissolve the insulating film 32 at the interface between the insulating film 32 and the needle P. The further inserting of the needle P causes the needle P to reach the gate line coupling part 34b. The inserting pressure of the needle P is controlled so that the needle P does not damage the gate line coupling part 34b. Also, since the solvent included in the needle P dissolves the insulating film 32, the needle P does not need to be brought into physical contact with the insulating film 32 and the gate line coupling part 34b.

Finally, a hole having a diameter larger than that of the needle P is formed in the insulating film 32. A gap is therefore provided at the interface between the insulating film 32 and needle P. Thus, the needle P can easily be drawn out from the insulating film 32 since frictional force does not work at the interface when drawing the needle P out.

Figure 4B:
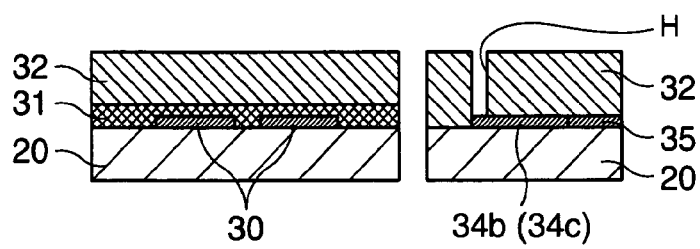

As a result, as shown in FIG. 4B, the contact hole H reaching up to the surface of the gate line coupling part 34b is formed in the insulating film 32.

It is preferable that the needle P is inserted substantially normal to the insulating film 32 in order to prevent the hole diameter from being unnecessarily enlarged by the solvent applied to the needle P.

Figure 4C:
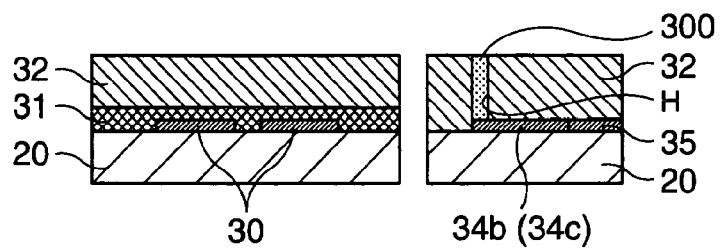

Then, as shown in FIG. 4C, an electrically conductive material is discharged so as to be buried in the contact hole H using the ink jet method, forming the conductive part 300.

Since the contact hole H reaches the surface of the gate line coupling part 34b as described above, electrical coupling to the gate line coupling part 34b is allowed via the conductive part 300 made up of the conductive material buried in the contact hole H.

Plural contact holes H may simultaneously be formed by using plural needles P arranged with a predetermined pitch, for reducing the number of manufacturing steps. Thus, the forming of plural conductive parts 300 may be facilitated even if a large number of pixels are to be formed.

In the ink jet method, a conductive material is discharged to predetermined positions on the insulating layer 32 by operating an inkjet head (not shown) and a moving mechanism (not shown) for relatively moving the inkjet head and the substrate 20. The pattern of discharging the liquid material is determined based on electronic data such as a bitmap pattern stored in the droplet-discharge device. Therefore, the liquid material can be applied to desired positions simply by preparing such electronic data.

Droplets are discharged from the inkjet head by either of the following methods: a piezoelectric method that changes the volume of an ink cavity by piezoelectric elements; and a thermal method that generates air bubbles by heating the ink in an ink cavity. In the case of discharging a liquid with functionality, such as ink including a conductive, insulating, or semiconductor substance, the piezoelectric method, which involves no heat effect, is preferably employed.

As the liquid material, a water dispersion of polyethylene dioxy thiophene (PEDOT) is used. Instead of PEDOT, metal colloid can also be used. The main component of such dispersion liquid is water. Alternatively, an alcohol-added liquid also can be discharged as droplets to form contacts.

Figure 4D:
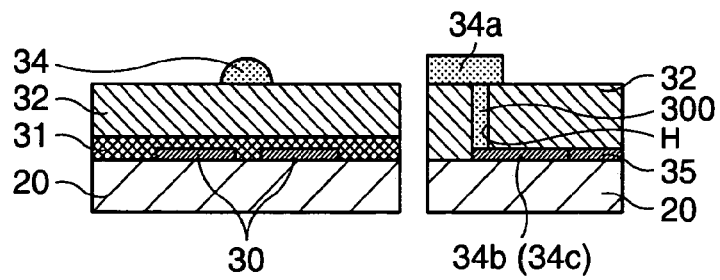

As shown in FIG. 4D, an electrically conductive material is discharged on the insulating layer 32 by using the ink jet method, and thereby the gate electrode 34 is formed to overlap the region (channel) between the source and drain electrodes 30, forming the organic thin-film transistor 10a.

Subsequently, the gate line 34a for coupling the conductive part 300 to the gate electrode 34 is formed by discharging a conductive material by the ink jet method. Although only part of the gate line 34a is illustrated in FIG. 4D, the gate line 34a is coupled to the gate electrode 34 actually.

The gate lines 34a are coupled to the plural gate electrodes 34 as shown in FIG. 1. The gate lines 34a are straight lines extending along the X-direction. Therefore, the ink jet method can form the gate lines 34a by discharging droplets while scanning the discharge head above the substrate 20 along a single direction.

Figure 4E:
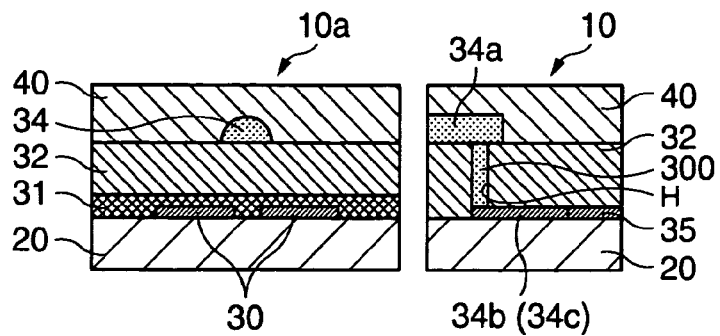

Finally, as shown in FIG. 4E, the protective film 40 is formed to cover the insulating film 32 and the gate electrode 34 by applying a polymer solution by spin coating. In addition, the pixel electrodes D may be formed to correspond to the organic transistors 10a (see FIG. 1). If there is a need to apply a current to a current-driven device such as an organic EL device, or a need to apply voltage to a voltage-driven device such as a liquid crystal device, pixel electrodes may be formed on the protective film 40 and the conductive parts 300 may be formed in the film 40 through the above-described procedure to couple the pixel electrodes to the organic transistors 10a.

The circuit board 10 is obtained through the above-described steps.

In such a method for forming a contact hole, the needle P mechanically perforates the insulating film 32 to reach the surface of the gate line coupling part 34b while the interface between the needle P and the insulating film 32 is chemically dissolved by a solvent included in the needle P. Thereby, the contact hole H, to the gate line coupling part 34b, having a diameter larger than that of the needle P can be formed. Thus, the contact hole H is not blocked due to the elastic force of the insulating film 32. As a result, by burying a conductive material in the contact hole H so that the material is brought into contact with the gate line coupling part 34b, the conductive part 300 can be formed with high reliability for surely allowing electrical coupling to the gate line coupling part 34b. Note that the needle P need not be brought in contact with the insulating film 32. It will be obvious that the contact hole H may be completed only by the dissolution of the insulating film 32 due to the solvent included in the needle.

Also, in the embodiment of the invention, the insulating film 32 need not be everted with the needle P when forming the contact hole H. Therefore, projections resulting from the everted portions are not formed on the surface of the insulating film 32. Thus, when forming, on the insulating film 32, the gate line 34a coupling the gate electrode 34 to the gate line coupling part 34b via the conductive part 300, breakage of the gate line 34a due to the projections can be avoided.

Accordingly, the reliability of electrical coupling between the gate electrode 34 and the gate line coupling part 34b can be improved.

The conductive part 300 can be formed by discharging a conductive material in the contact hole H by the ink jet method. Also, the gate line 34a coupling the gate electrode 34 to the conductive part 300 also can be formed in the same discharging step, reducing the number of manufacturing steps.

The circuit board 10 includes the organic thin-film transistors 10a. The semiconductor layer 31 formed between the gate electrode 34 and the gate line coupling part 34b is made of an organic film.

By using the method for forming a contact hole according to the illustrative embodiment of the invention described, the semiconductor layer 31 on the gate line coupling part 34b also can be dissolved by the solvent included in the needle P, allowing the contact hole H to be formed between the gate electrode 34 and the gate line coupling part 34b. Thus, the conductive part 300 having high reliability can be formed as described above.

It should be noted that the described embodiment does not limit the invention, and various modifications and changes can be made. For example, in the present embodiment, the gate electrode 34 and the gate line 34a are formed after burying a conductive material in the contact hole H to form the conductive part 300. Alternatively, after forming the gate electrode 34 and the gate line 34a, a conductive material may be buried in the contact hole H to form the conductive part 300.

Figure 6:
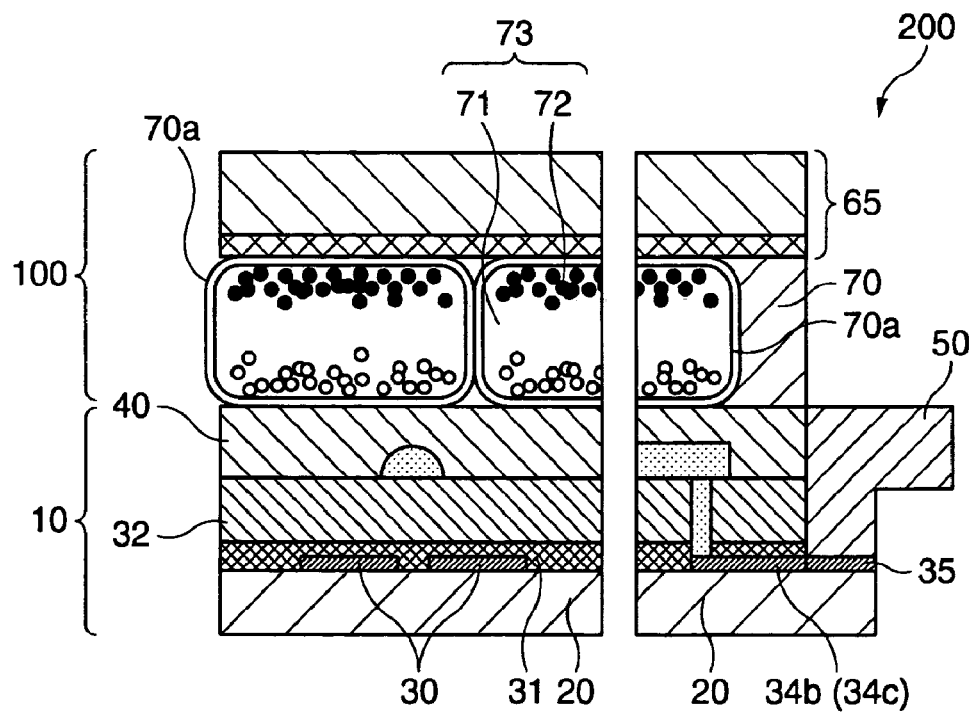
FIG. 6 is a sectional view of an electrophoretic device manufactured according to aspects of the invention.

FIG. 6 is a diagram showing an electro-optical device obtained according to an illustrative embodiment of the invention, and illustrates an electrophoretic device 200.

The electrophoretic device 200 includes the circuit board 10, an electrophoretic display part 100 and a flexible printed circuit (abbreviated as FPC, hereinafter) 50 coupled to the circuit board 10. The circuit board 10 is the same as that in the above-described embodiment.

Referring to FIG. 6, the electrophoretic display part 100 includes a counter substrate 65 provided to face the circuit board 10, and an electrophoretic layer 70 provided between the circuit board 10 and substrate 65.

The electrophoretic layer 70 includes a plurality of microcapsules 70a.

Each of the microcapsules 70a is made of a resin film, and is substantially as large as one pixel. The plurality of microcapsules 70a is provided to cover the whole display area. More specifically, the neighboring microcapsules 70a are placed close to each other, so that the display area is covered by the microcapsules 70 leaving no space therebetween. An electrophoretic dispersion liquid 73 having a dispersion medium 71, electrophoretic particles 72, etc. is encapsulated in each of the microcapsules 70a.

The electrophoretic dispersion liquid 73 having the dispersion medium 71 and the electrophoretic particles 72 will now be described in greater detail.

In the electrophoretic dispersion liquid 73, the electrophoretic particles 72 are dispersed in the dispersion medium 71 stained with a dye.

The electrophoretic particles 72 are substantially spherical, fine particles with the diameter of about 0.01 to 10 μm. They are made of an inorganic oxide or inorganic hydroxide and have a hue (including black and white) different from that of the dispersion medium 71. The electrophoretic particles 72 made of an oxide or hydroxide have an intrinsic surface isoelectric point. The surface charge density (charge quantity) of the electrophoretic particles 72 varies depending on the hydrogen-ion exponent pH of the dispersion medium 71.

The surface isoelectric point indicates a state where the algebraic sum of charges of the ampholyte in the solution is zero, represented by a hydrogen-ion exponent pH. For example, if the pH of the dispersion medium 71 is equal to the surface isoelectric point of the electrophoretic particles 72, the effective charge of the particles is zero, and therefore the particles do not respond to an external electric field. If the pH of the dispersion medium 71 is lower than the surface isoelectric point of the particles, the surfaces of the particles are positively charged based on the formula (1) below.

In contrast, if the pH of the dispersion medium 71 is higher than the surface isoelectric point of the particles, the surfaces of the particles are negatively charged based on the formula (2) below.

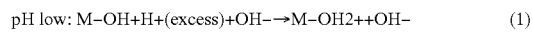

$$\text{pH low: M-OH+H+(excess)+OH-} \rightarrow \text{M-OH2++OH-} \quad (1)$$

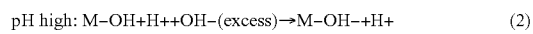

$$\text{pH high: M-OH+H++OH-(excess)} \rightarrow \text{M-OH-+H+} \quad (2)$$

As the difference between the pH of the dispersion medium 71 and the surface isoelectric point of the particles increases, the charge quantity of the particles increases in accordance with the formula (1) or (2). When the difference exceeds a certain level, the charge quantity is nearly saturated and a further pH change does not lead to the corresponding change of the charge quantity. Although the difference value at the saturation point varies depending on the type, size, shape, etc.

of the particle, one or more of the difference values will cause the charge quantity to be nearly saturated, for any particle.

As the electrophoretic particle 72, for example, titanium dioxide, zinc oxide, magnesium oxide, colcothar, aluminum oxide, black lower titanium oxide, chromium oxide, boehmite, FeOOH, silicon dioxide, magnesium hydroxide, nickel hydroxide, zirconium oxide, or copper oxide can be used.

The electrophoretic particle 72 can be used not only as a plain particle, but also with its surface modified in various ways. For example, the particle surface can be modified by the following treatment: coating treatment with a polymer such as acrylic resin, epoxy resin, polyester resin or polyurethane resin; coupling treatment with a coupling agent such as a silane, titanate, aluminate or fluorine coupling agent; or graft polymerization with an acrylic monomer, styrene monomer, epoxy monomer, isocyanate monomer, or another monomer. One or a combination of two or more of the above treatment can be performed.

As the dispersion medium 71, a non-aqueous organic solvent such as hydrocarbon, halogen hydrocarbon, or ether is used. The dispersion medium 71 is stained with a dye, such as Spirit Black, Oil Yellow, Oil Blue, Oil Green, Valifast Blue, Macrolex Blue, Oil Brown, Sudan Black, or Fast Orange, to assume a different hue from the electrophoretic particles 72.

As shown in FIG. 6, the FPC 50 is coupled to the external coupling terminal 35 on the circuit board 10.

The FPC 50 is a circuit board having driving circuits (not shown) for driving the organic transistors 10a (see FIG. 2) of the circuit board 10. The FPC 50 supplies power to source lines of the circuit board 10 and supplies driving signals to the gate lines 34a, thereby driving the organic thin-film transistors 10a.

The FPC 50 is coupled to the circuit board 10 via an anisotropic conductive film (ACF) or anisotropic conductive paste (ACP) after removing the semiconductor layer 31, the insulating film 32 and the protective film 40 over the external coupling terminals 35 by using photolithography and etching.

In the method for manufacturing an electro-optical device, the method for forming the conductive parts 300 is used.

Thus, the conductive parts 300 having high reliability are provided while the breaking of the gate lines 34a coupling the gate electrodes 34 to the gate line coupling parts 34b is prevented. As a result, the reliability of the manufactured electrophoretic device 200 itself can be improved.

The invention claimed is:

1. A manufacturing apparatus for forming a hole in a film, comprising:
   a needle that is adapted to insert into and perforate the film and to dissolve a part of the film by a solvent, the needle having a hollow structure, the solvent being provided to the film through the hollow structure of the needle.

2. A manufacturing apparatus for forming a hole in a film, comprising:
   a plurality of needles, each of the plurality of needles being adapted to insert into and perforate the film and to dissolve a part of the film by a solvent, each of the plurality of needles having a hollow structure, the solvent being provided to the film through the corresponding hollow structure.

3. The manufacturing apparatus according to claim 1, strength of the needle being stronger than that of the film.

4. A manufacturing apparatus for forming a hole in a film, comprising:
   a needle that is adapted to insert into and perforate the film and to dissolve a part of the film by a solvent, the needle having a porous structure, the solvent being provided to the film through the porous structure of the needle.

5. A manufacturing apparatus for forming a hole in a film, comprising:
   a plurality of needles, each of the plurality of needles being adapted to insert into and perforate the film and to dissolve a part of the film by a solvent, each of the plurality of needles having a porous structure, the solvent being provided to the film through the corresponding porous structure.

6. The manufacturing apparatus according to claim 4, strength of the needle being stronger than that of the film.

* * * * *